(12) United States Patent
Kawabuchi et al.

(10) Patent No.: US 9,805,957 B2
(45) Date of Patent: Oct. 31, 2017

(54) SUBSTRATE PROCESSING APPARATUS, SUBSTRATE PROCESSING METHOD AND COMPUTER-READABLE STORAGE MEDIUM RECORDING THEREIN SUBSTRATE PROCESSING PROGRAM

(71) Applicant: Tokyo Electron Limited, Tokyo (JP)

(72) Inventors: Yosuke Kawabuchi, Koshi (JP); Hisashi Kawano, Koshi (JP); Satoru Tanaka, Koshi (JP); Hiroyuki Suzuki, Koshi (JP); Kotaro Oishi, Koshi (JP); Kazuyoshi Shinohara, Koshi (JP); Yuki Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 536 days.

(21) Appl. No.: 14/296,813

(22) Filed: Jun. 5, 2014

(65) Prior Publication Data

US 2014/0360536 A1  Dec. 11, 2014

(30) Foreign Application Priority Data

Jun. 7, 2013 (JP) .................................. 2013-120702
May 1, 2014 (JP) .................................. 2014-094641

(51) Int. Cl.
*H01L 21/67* (2006.01)
*H01L 21/02* (2006.01)

(52) U.S. Cl.
CPC .. *H01L 21/67051* (2013.01); *H01L 21/02057* (2013.01); *H01L 21/6715* (2013.01); *H01L 21/67028* (2013.01)

(58) Field of Classification Search
CPC .................. H01L 21/67051; H01L 21/02041
See application file for complete search history.

(56) References Cited

U.S. PATENT DOCUMENTS 5,882,433 A * 3/1999 Ueno ................ H01L 21/67028
134/31
7,837,804 B2 * 11/2010 Ohno ....................... B08B 3/02
134/18

(Continued)

FOREIGN PATENT DOCUMENTS

JP        10-172951 A      6/1998
JP        11307508 A  *  11/1999

(Continued)

OTHER PUBLICATIONS

Machine translation of Jodai, K.; JP11-307508; 1999.*

*Primary Examiner* — Michael Kornakov
*Assistant Examiner* — Natasha Campbell
(74) *Attorney, Agent, or Firm* — Pearne & Gordon LLP

(57) ABSTRACT

A throughput in processing a substrate can be improved and a running cost thereof can be reduced. A substrate processing apparatus 1 that processes a substrate 3 with a processing liquid and dries the substrate 3 includes a substrate rotating device 22 configured to rotate the substrate 3; a processing liquid discharging unit 13 configured to discharge the processing liquid toward the substrate 3; a substitution liquid discharging unit 14 configured to discharge a substitution liquid, which is substituted with the processing liquid on the substrate 3, toward the substrate 3 while relatively moving with respect to the substrate 3; and an inert gas discharging unit 15 configured to discharge an inert gas toward a peripheral portion of the substrate 3 in an inclined direction from above the substrate 3 while moving in a direction different from a direction in which the substitution liquid discharging unit 14 is moved.

11 Claims, 9 Drawing Sheets

(56) References Cited

U.S. PATENT DOCUMENTS

| | | | |
|---|---|---|---|
| 8,337,659 B2 | 12/2012 | Orii | |
| 2001/0024767 A1* | 9/2001 | Toshima | G03F 7/3021 430/313 |
| 2006/0086373 A1* | 4/2006 | Park | H01L 21/67034 134/6 |
| 2006/0234503 A1* | 10/2006 | Yamada | B08B 1/04 438/667 |
| 2007/0223342 A1* | 9/2007 | Orii | H01L 21/02052 369/69 |

FOREIGN PATENT DOCUMENTS

| | | |
|---|---|---|
| JP | 2003-203892 A | 7/2003 |
| JP | 2008-016781 A | 1/2008 |
| JP | 2010-045389 A | 2/2010 |

\* cited by examiner

SUBSTRATE PROCESSING APPARATUS, SUBSTRATE PROCESSING METHOD AND COMPUTER-READABLE STORAGE MEDIUM RECORDING THEREIN SUBSTRATE PROCESSING PROGRAM

CROSS-REFERENCE TO RELATED APPLICATION

This application claims the benefit of Japanese Patent Application Nos. 2013-120702 and 2014-094641 filed on Jun. 7, 2013, and May 1, 2014, respectively, the entire disclosures of which are incorporated herein by reference.

TECHNICAL FIELD

The embodiments described herein pertain generally to a substrate processing apparatus and a substrate processing method in which a processing liquid on a substrate is substituted with a substitution liquid after processing the substrate with the processing liquid, and then, the substrate is dried by removing the substitution liquid by way of discharging an inert gas to the substitution liquid on the substrate and a computer-readable storage medium recording therein a substrate processing program.

BACKGROUND

Conventionally, when manufacturing a semiconductor device, a flat panel display, or the like, various liquid processes such as a cleaning process or an etching process are performed on a substrate such as a semiconductor wafer or a liquid crystal substrate by using a substrate processing apparatus.

For example, in a substrate processing apparatus configured to perform a cleaning process on a substrate, a cleaning liquid is supplied onto the substrate which is being rotated, and a surface of the substrate is cleaned by the cleaning liquid. Thereafter, a rinse liquid is supplied onto the substrate, and the surface of the substrate is rinsed by the rinse liquid. Afterwards, a substitution liquid (e.g., IPA (Isopropyl alcohol)) having higher volatility than that of the processing liquid (here, the rinse liquid (e.g., pure water)) used to process the surface of the substrate is supplied, so that the pure water is substituted with the IPA. Then, by dispersing the IPA outward from the surface of the substrate by a centrifugal force caused by rotation of the substrate while discharging an inert gas (e.g., a nitrogen gas), the surface of the substrate is dried.

In a conventional substrate processing apparatus, an IPA discharge nozzle configured to discharge IPA and a nitrogen gas discharge nozzle configured to discharge a nitrogen gas are provided at a single arm with a gap therebetween. The IPA discharge nozzle is configured to discharge the IPA vertically downward toward substrate, and the nitrogen gas discharge nozzle is also configure to discharge the nitrogen gas vertically downward toward the substrate (see, for example, Patent Document 1).

Further, in the conventional substrate processing apparatus, by moving the arm outward from a position above a central portion of the substrate in one direction while discharging the IPA and the nitrogen gas, the IPA on the substrate is pushed away outward by the nitrogen gas.

Patent Document 1: Japanese Patent Laid-open Publication No. 2010-045389

In the conventional substrate processing apparatus, however, if the gap between the IPA discharge nozzle and the nitrogen gas discharge nozzle becomes larger, the IPA may not be pushed away from the substrate by the nitrogen gas. In such a case, the IPA may remain on the substrate, so that particle generation or damage of a circuit pattern may occur. For this reason, the gap between the IPA discharge nozzle and the nitrogen gas discharge nozzle needs to be narrowed. If the gap therebetween is narrowed, however, the IPA may be dispersed by the nitrogen gas. Thus, a flow rate of the nitrogen gas needs to be reduced, and the IPA discharge nozzle and the nitrogen gas discharge nozzle need to be moved at a low speed. As a result, it would take a long time to dry the substrate, and consumption of the IPA would be increased.

Further, in order to increase the flow rate of the nitrogen gas, the IPA discharge nozzle and the nitrogen gas discharge nozzle may be provided independently and moved in different directions. In such a configuration, however, if the nitrogen gas discharged from the nitrogen gas discharge nozzle passes by an interface between a liquid film of the IPA and a substrate surface from which the IPA is removed, the IPA may not be pushed away from the substrate, so that particles are generated or patterns are damaged. Thus, the nitrogen gas discharge nozzle needs to be moved at a low speed not to pass by the IPA interface. Accordingly, the time taken for drying the substrate may be increased.

SUMMARY

In view of the foregoing problems, example embodiments provide a substrate processing apparatus capable of shortening a time required for drying a substrate and capable of reducing consumption of IPA.

In one example embodiment, a substrate processing apparatus that processes a substrate with a processing liquid and dries the substrate includes a substrate rotating device configured to rotate the substrate; a processing liquid discharging unit configured to discharge the processing liquid toward the substrate; a substitution liquid discharging unit configured to discharge a substitution liquid, which is substituted with the processing liquid on the substrate, toward the substrate while relatively moving with respect to the substrate; and an inert gas discharging unit configured to discharge an inert gas toward a peripheral portion of the substrate in an inclined direction from above the substrate while moving in a direction different from a direction in which the substitution liquid discharging unit is moved.

The substitution liquid discharging unit may form an interface, where a liquid film of the substitution liquid is thicker at a peripheral portion side of the substrate than at a central portion side thereof, by discharging the substitution liquid toward the substrate while moving in a direction from a central portion of the substrate toward the peripheral portion thereof, and the inert gas discharging unit may discharge the inert gas toward the central portion side of the substrate inner than the interface.

The inert gas discharging unit may discharge the inert gas in the inclined direction toward a normal line direction of the interface of the substitution liquid formed on the substrate.

The inert gas discharging unit may serve to form the interface by discharging the inert gas vertically downward from above the central portion of the substrate before moving with respect to the substrate, and then, the inert gas discharging unit may discharge the inert gas in the inclined direction toward the peripheral portion of the substrate while moving toward the peripheral portion of the substrate.

The substitution liquid discharging unit may substitute the processing liquid with the substitution liquid by discharging the substitution liquid toward the substrate from above a central portion of the substrate before moving with respect to the substrate.

The processing liquid discharging unit may form a liquid film of the processing liquid by discharging the processing liquid toward a peripheral side of the substrate outer than a position where the substitution liquid is discharged, and then, a liquid film of the substitution liquid may be formed by stopping the discharge of the processing liquid.

The inert gas discharging unit may be moved at a speed where a discharge rate of the inert gas per a unit area of the substrate is controlled to be constant.

The substitution liquid discharging unit may be moved at a speed where a discharge rate of the substitution liquid per a unit area of the substrate is controlled to be constant.

The inert gas discharging unit and the substitution liquid discharging unit may be moved at the same speed.

In another example embodiment, a substrate processing method of processing a substrate with a processing liquid and drying the substrate includes discharging the processing liquid toward the substrate while rotating the substrate, and then; discharging a substitution liquid toward the substrate while moving the substitution liquid relatively with respect to the substrate; and pushing away the substitution liquid by discharging an inert gas toward the substrate in an inclined direction from above the substrate toward a peripheral portion of the substrate while moving the inert gas relatively with respect to the substrate in a direction different from a direction in which the substitution liquid is moved.

An interface, where a liquid film of the substitution liquid is thicker at a peripheral portion side of the substrate than at a central portion side thereof, may be formed by discharging the substitution liquid toward the substrate while moving from a central portion of the substrate toward the peripheral portion thereof, and then the inert gas may be discharged toward the central portion side of the substrate inner than the interface.

The inert gas may be discharged in the inclined direction toward a normal line direction of the interface of the substitution liquid formed on the substrate.

The inert gas may be discharged vertically downward from above the central portion of the substrate to serve to form the interface, and then, the inert gas may be discharged in the inclined direction with respect to the substrate while moving from above the central portion of the substrate toward the peripheral portion thereof.

Before the substitution liquid is discharged toward the substrate while moving with respect to the substrate, the processing liquid may be substituted with the substitution liquid by discharging the substitution liquid toward the substrate from above the central portion of the substrate.

When forming the liquid film of the substitution liquid on the substrate by discharging the substitution liquid toward the substrate, a liquid film of the processing liquid may be formed by discharging the processing liquid toward a peripheral side of the substrate outer than a position where the substitution liquid is discharged, and then, the liquid film of the substitution liquid may be formed by stopping the discharge of the processing liquid.

The inert gas may be discharged while moving at a speed where a discharge rate of the inert gas per a unit area of the substrate is controlled to be constant.

The substitution liquid may be discharged while moving at a speed where a discharge rate of the substitution liquid per a unit area of the substrate is controlled to be constant.

The inert gas and the substitution liquid may be discharged while moving at the same speed.

In another example embodiment, a computer-readable storage medium has stored thereon computer-executable instructions that, in response to execution, cause a substrate processing apparatus to perform a substrate processing program of processing a substrate with a processing liquid and drying the substrate. Further, the substrate processing apparatus includes a substrate rotating device configured to rotate the substrate; a processing liquid discharging unit configured to discharge the processing liquid toward the substrate; a substitution liquid discharging unit configured to discharge a substitution liquid, which is substituted with the processing liquid on the substrate, toward the substrate; and an inert gas discharging unit configured to discharge an inert gas toward the substrate. Furthermore, the substrate processing program includes discharging the processing liquid toward the substrate from the processing liquid discharging unit while rotating the substrate by the substrate rotating device, and then; discharging the substitution liquid toward the substrate from the substitution liquid discharging unit while moving the substitution liquid discharging unit relatively with respect to the substrate, and pushing away the substitution liquid by discharging the inert gas toward the substrate in an inclined direction from above the substrate toward a peripheral portion of the substrate while moving the inert gas discharging unit relatively with respect to the substrate in a direction different from a direction in which the substitution liquid discharging unit is moved.

In accordance with the various example embodiments, the time required for drying the substrate can be shorted and consumption of the substitution liquid can be reduced. Thus, it may be possible to improve a throughput and reduce a running cost in substrate processing.

BRIEF DESCRIPTION OF THE DRAWINGS

In the detailed description that follows, embodiments are described as illustrations only since various changes and modifications will become apparent from the following detailed description. The use of the same reference numbers in different figures indicates similar or identical items.

DETAILED DESCRIPTION

Figure 1:
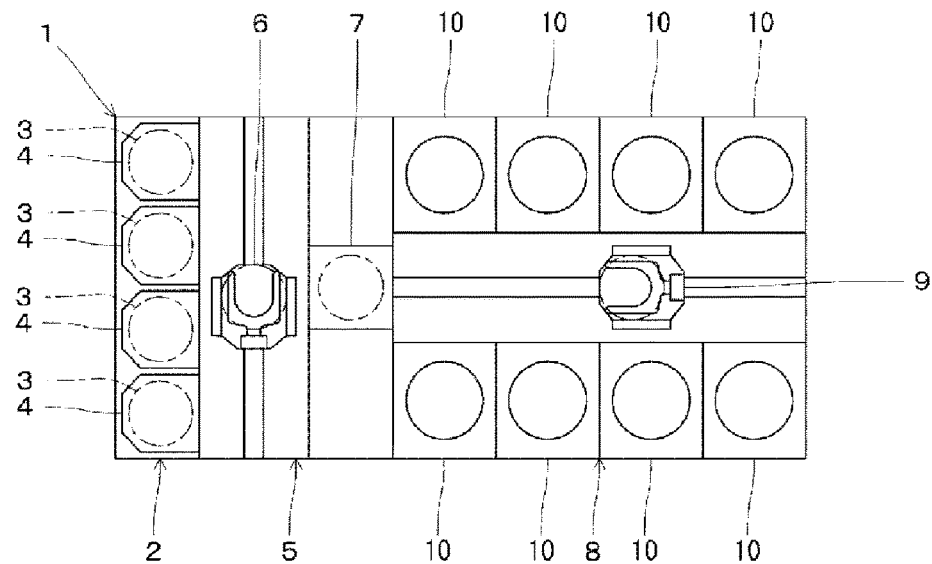
FIG. 1 is a plane view of a substrate processing apparatus.

In the following, example embodiments will be described, and reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Below, a specific configuration of a substrate processing apparatus and a substrate processing method in accordance with an example embodiment will be described with reference to the accompanying drawings.

(First Example Embodiment)

As depicted in FIG. 1, a substrate processing apparatus 1 in accordance with a first example embodiment includes a loading/unloading section 2 provided at a front end thereof. Carriers 4, each of which accommodates therein a multiple number (e.g., 25 sheets) of substrates 3 (herein, semiconductor wafers), are loaded into or unloaded from the loading/unloading section 2. The carriers 4 are mounted in the loading/unloading section 2 side by side in a left/right direction.

Further, the substrate processing apparatus 1 also includes a transfer section 5 at the rear side of the loading/unloading section 2. Within the transfer section 5, a substrate transfer device 6 is provided at a front side thereof, and a substrate transit table 7 is provided at a rear side thereof. In the transfer section 5, a substrate 3 is transferred between one of the carriers 4 mounted in the loading/unloading section 2 and the substrate transit table 7 by using the substrate transfer device 6.

Further, the substrate processing apparatus 1 also includes a processing section 8 at the rear side of the transfer section 5. Within the processing section 8, a substrate transfer device 9 extended in a forward/backward direction is provided at a central portion of the processing section 8, and substrate liquid processing apparatuses 10 each performing a liquid process on the substrate 3 are arranged side by side in the forward/backward direction at left/right sides of the substrate transfer device 9. In this processing section 8, the substrate 3 is transferred between the substrate transit table 7 and a substrate liquid processing apparatus 10 by using the substrate transfer device 9, and a liquid process is performed on the substrate 3 in the substrate liquid processing apparatus 10.

Figure 2:
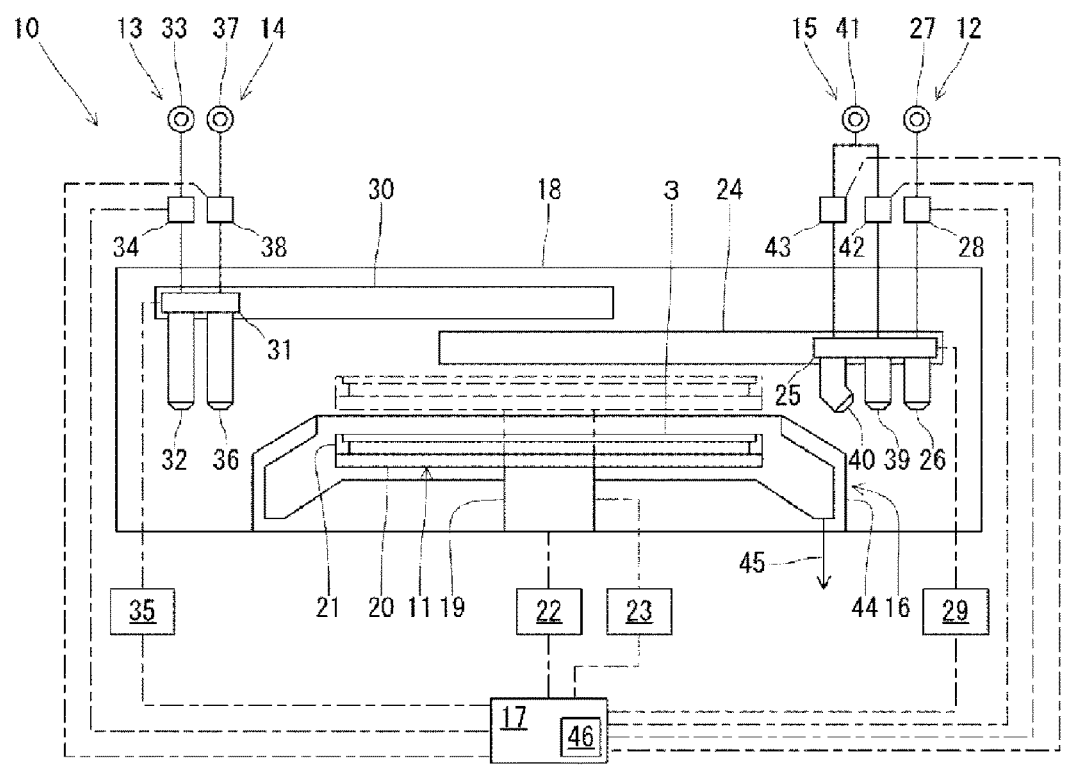
FIG. 2 is a side cross sectional view illustrating a substrate liquid processing apparatus in accordance with a first example embodiment.
Figure 3:
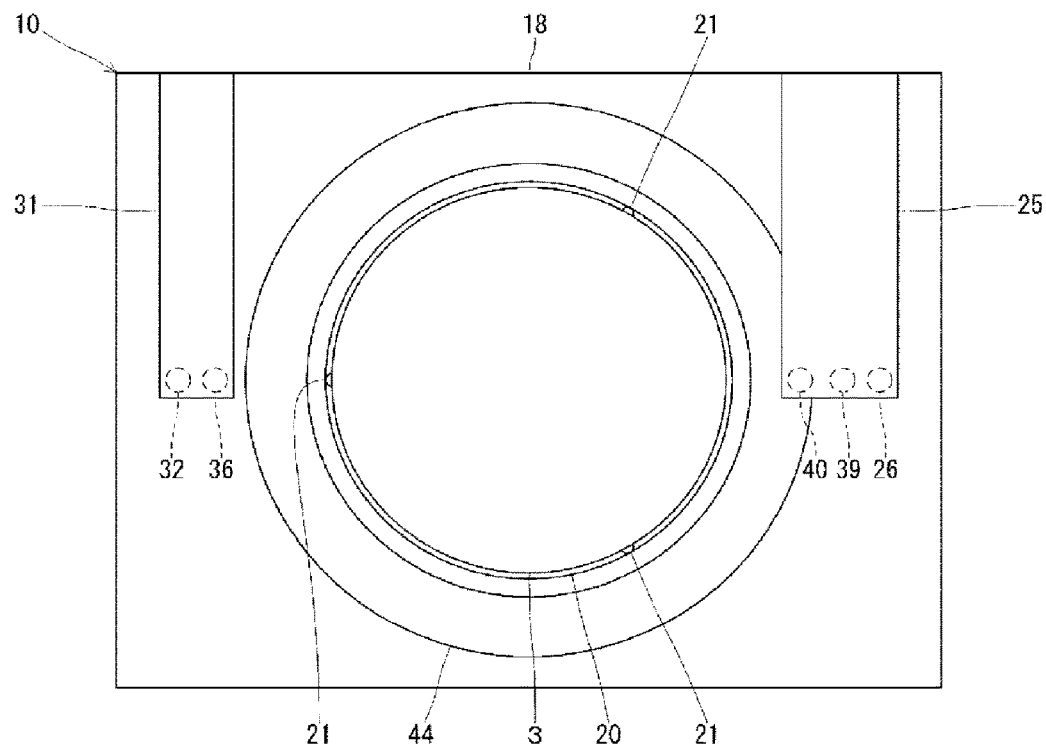
FIG. 3 is a plane view of the substrate liquid processing apparatus in accordance with the first example embodiment.

Each substrate liquid processing apparatus 10 includes, as depicted in FIG. 2 and FIG. 3, a substrate holding unit 11 configured to hold and rotate a substrate 3 thereon; a cleaning liquid discharging unit 12 configured to discharge a cleaning liquid to the substrate 3 as a processing liquid; a rinse liquid discharging unit 13 configured to discharge a rinse liquid to the substrate 3 as a processing liquid; a substitution liquid discharging unit 14 configured to discharge a substitution liquid to the substrate 3; an inert gas discharging unit 15 configured to discharge an inert gas to the substrate 3; a collecting unit 16 configured to collect the cleaning liquid, the rinse liquid, the substitution liquid, or the like; and a controller 17 configured to control these components. Here, this substitution liquid may refer to a liquid having higher volatility than that of the processing liquid formed on a surface of the substrate 3.

The substrate holding unit 11 includes a vertically extended rotation shaft 19 which is rotatably provided at an approximately central portion of a substrate processing chamber 18. A circular plate-shaped turntable 20 is horizontally provided on an upper end of the rotation shaft 19. Three substrate holders 21 are provided at an outer periphery of the turntable 20 at a regular distance in a circumferential direction thereof.

Further, the substrate holding unit 11 also includes a substrate rotating device 22 and a substrate elevating device 23 which are connected to the rotation shaft 19. Rotation of the substrate rotating device 22 and vertical movement of the substrate elevating device 23 are controlled by the controller 17.

In the substrate holding unit 11, the substrate 3 is horizontally held by the substrate holders 21 of the turntable 20. Further, in the substrate holding unit 11, the substrate 3 held on the turntable 20 is rotated by the substrate rotating device 22, and the turntable 20 and the substrate 3 are moved up and down by the substrate elevating device 23.

The cleaning liquid discharging unit 12 includes a guide rail 24 horizontally extended in the left/right direction within the substrate processing chamber 18, and an arm 25 horizontally extended in the forward/backward direction is provided at the guide rail 24 to be movable in the left/right direction. A cleaning liquid discharge nozzle 26 is provided vertically downward at a right end of a lower portion of a leading end of the arm 25. A cleaning liquid supply source 27 configured to supply a cleaning liquid (e.g., SC-1) is connected to the cleaning liquid discharge nozzle 26 via a flow rate controller 28. The flow rate controller 28 is controlled by the controller 17.

Further, the cleaning liquid discharging unit 12 includes a first nozzle moving device 29 connected to the arm 25. Movement of the first nozzle moving device 29 is controlled by the controller 17.

In the cleaning liquid discharging unit 12, the cleaning liquid discharge nozzle 26 is configured to be movable between a position (supply start position) above a central portion of the substrate 3 and a right side position (retreat position) at the outside of the substrate 3 by the first nozzle moving device 29. The cleaning liquid discharging unit 12 discharges the cleaning liquid toward a surface (top surface) of the substrate 3.

The rinse liquid discharging unit 13 includes a guide rail 30 horizontally extended in the left/right direction within the substrate processing chamber 18, and an arm 31 horizontally extended in the forward/backward direction is provided at the guide rail 30 to be movable in the left/right direction. A rinse liquid discharge nozzle 32 is provided vertically downward at a left end of a lower portion of a leading end of the arm 31. A rinse liquid supply source 33 configured to supply a rinse liquid (e.g., pure water) is connected to the rinse liquid discharge nozzle 32 via a flow rate controller 34. The flow rate controller 34 is controlled by the controller 17.

Further, the rinse liquid discharging unit 13 also includes a second nozzle moving device 35 connected to the arm 31. Movement of the second nozzle moving device 35 is controlled by the controller 17.

In the rinse liquid discharging unit 13, the rinse liquid discharge nozzle 32 is configured to be movable between the position (supply start position) above the central portion of the substrate 3 and a left side position (retreat position) at the outside of the substrate 3 by the second nozzle moving device 35. The rinse liquid discharging unit 13 discharges the rinse liquid toward the surface (top surface) of the substrate 3.

The substitution liquid discharging unit 14 includes a substitution liquid discharge nozzle 36 provided vertically downward at a right end of the lower portion of the leading end of the left arm 31. A substitution liquid supply source 37 configured to supply a substitution liquid (e.g., IPA) is connected to the substitution liquid discharge nozzle 36 via a flow rate controller 38. The flow rate controller 38 is controlled by the controller 17.

In the substitution liquid discharging unit 14, the substitution liquid discharge nozzle 36 is configured to be movable between the position (supply start position) above the central portion of the substrate 3 and a left side position (retreat position) at the outside of the substrate 3 by the second nozzle moving device 35. The substitution liquid discharging unit 14 discharges the substitution liquid toward the surface (top surface) of the substrate 3.

The inert gas discharging unit 15 includes a first inert gas discharge nozzle 39 provided vertically downward at a central portion of the lower portion of the leading end of the right arm 25; and a second inert gas discharge nozzle 40 provided at a left end of the lower portion of the leading end of the right arm 25 to be inclined downward to the right. An inert gas supply source 41 configured to supply an inert gas (e.g., a nitrogen gas) is connected to the first inert gas discharge nozzle 39 and the second inert gas discharge nozzle 40 via flow rate controllers 42 and 43, respectively. The flow rate controllers 42 and 43 are controlled by the controller 17.

In the inert gas discharging unit 15, the first inert gas discharge nozzle 39 and the second inert gas discharge nozzle 40 are configured to be movable between the position (supply start position) above the central portion of the substrate 3 and a right side position (retreat position) at the outside of the substrate 3 by the first nozzle moving device 29. The inert gas discharging unit 15 discharges the inert gas toward the surface (top surface) of the substrate 3. At this time, the first inert gas discharge nozzle 39 is configured to discharge the inert gas vertically downward toward the surface of the substrate 3, whereas the second inert gas discharge nozzle 40 is configured to discharge the inert gas toward the surface of the substrate 3 in an inclined direction.

The collecting unit 16 includes a circular ring-shaped collecting cup 44 provided around the turntable 20. An opening having a larger size than that of the turntable 20 is formed at an upper end portion of the collecting cup 44. A drain 45 is connected to a lower end portion of the collecting cup 44.

The collecting unit 16 is configured to collect the processing liquid or the substitution liquid supplied onto the surface of the substrate 3 into the collecting cup 44, and is configured to drain out the collected processing liquid or substitution liquid to the outside from the drain 45.

The substrate processing apparatus 1 is configured as described above, and is controlled by the controller 17 according to various programs recorded on a storage medium 46 provided in the controller 17 (computer), so that a required process is performed on the substrate 3. Here, the storage medium 46 stores thereon various setup data or programs and may be implemented by a known device such as a memory including a ROM or a RAM, or a disk-type storage medium such as a hard disk, a CD-ROM, a DVD-ROM or a flexible disk.

Figure 11:
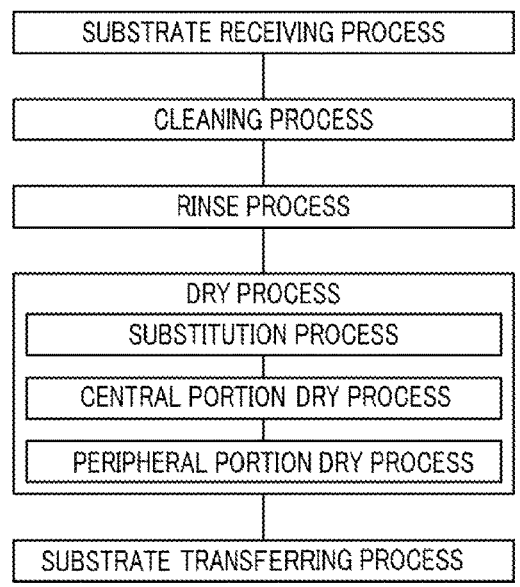
FIG. 11 is a flow chart showing a substrate processing program.

The substrate processing apparatus 1 performs a required process on the substrate 3 according to a substrate processing program (see FIG. 11) recorded on the storage medium 46, as will be described below.

First, as shown by a dashed dotted line in FIG. 2, in the substrate processing apparatus 1, a substrate liquid processing apparatus 10 receives a substrate 3 transferred by the substrate transfer device 9 (substrate receiving process).

In this substrate receiving process, the controller 17 controls the substrate elevating device 23 to move up the turntable 20 to a preset position. Then, the single substrate 3 transferred into the substrate processing chamber 18 from the substrate transfer device 9 is received by the substrate holders 21 to be horizontally held thereon. Thereafter, the turntable 20 is moved down to a preset position by the substrate elevating device 23. Further, in this substrate receiving process, the cleaning liquid discharge nozzle 26, the rinse liquid discharge nozzle 32, the substitution liquid discharge nozzle 36, and the first inert gas discharge nozzle 39 and the second inert gas discharge nozzle 40 are retreated to the retreat positions at the outside of the periphery of the turntable 20.

Figure 4:
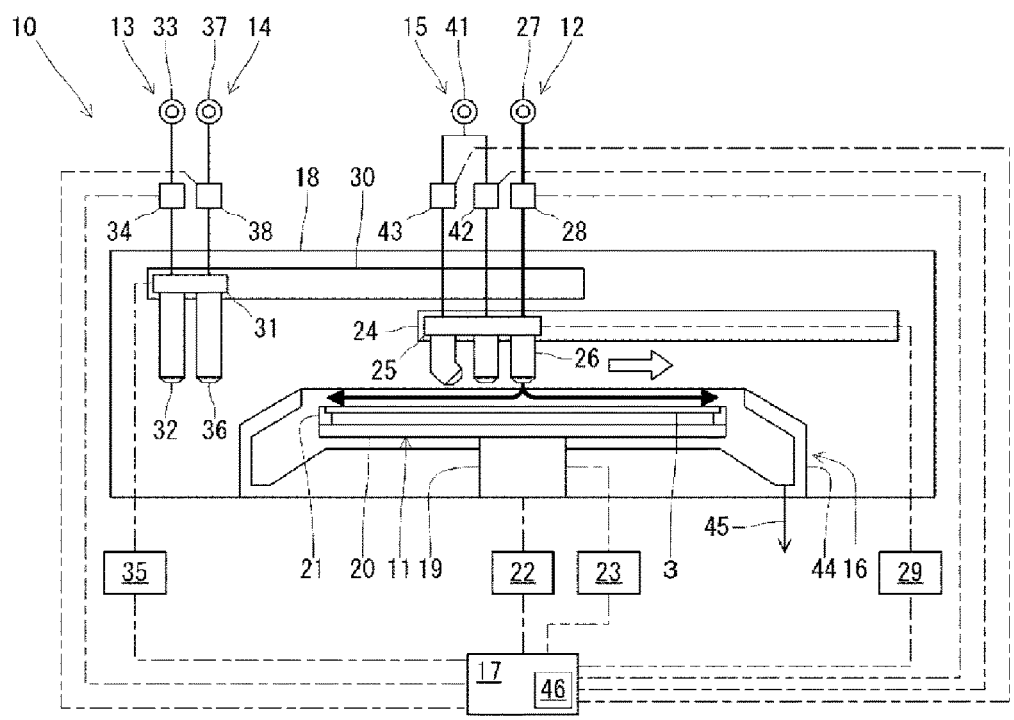
FIG. 4 is a diagram for describing an operation (cleaning process) of the substrate liquid processing apparatus in accordance with the first example embodiment.

Subsequently, as depicted in FIG. 4, the substrate processing apparatus 1 performs a cleaning process on the surface of the substrate 3 with a cleaning liquid (cleaning process).

In this cleaning process, the controller 17 controls the first nozzle moving device 29 to move the arm 25 such that the cleaning liquid discharge nozzle 26 is moved to the supply start position above the central portion of the substrate 3. Further, by rotating the turntable 20 at a certain rotation speed through the substrate rotating device 22, the substrate 3 is rotated. Thereafter, the cleaning liquid having a flow rate controlled to be a preset flow rate by the flow rate controller 28 is discharged toward a surface of the substrate 3 from the cleaning liquid discharge nozzle 26. The cleaning liquid supplied onto the substrate 3 is collected into the collecting cup 44 and discharged to the outside from the drain 45. Thereafter, the discharge of the cleaning liquid is stopped by the flow rate controller 28. Then, at the end of the cleaning process, the first nozzle moving device 29 moves the arm 25 such that the cleaning liquid discharge nozzle 26 is moved to the right side retreat position at the outside of the substrate 3.

Figure 5:
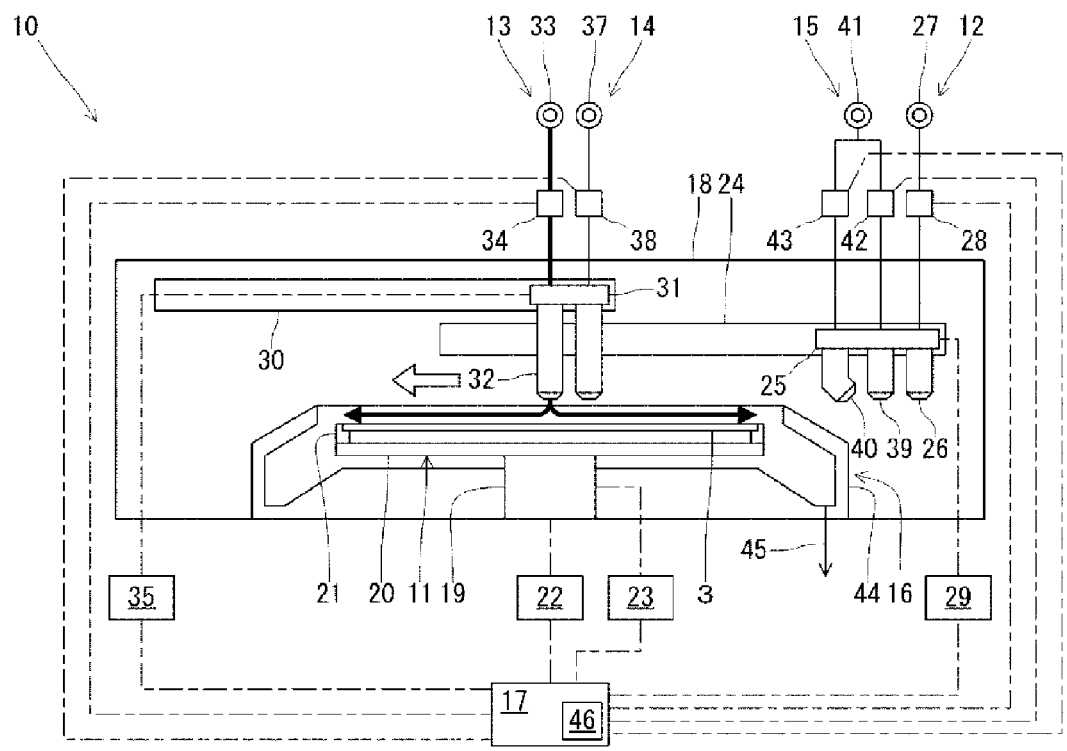
FIG. 5 is a diagram for describing an operation (rinse process) of the substrate liquid processing apparatus in accordance with the first example embodiment.

Then, as illustrated in FIG. 5, the substrate processing apparatus 1 performs a rinse process on the surface of the substrate 3 with a rinse liquid (rinse process).

In this rinse process, the controller 17 controls the second nozzle moving device 35 to move the arm 31 such that the rinse liquid discharge nozzle 32 is moved to the supply start position above the central portion of the substrate 3. Then, the rinse liquid having a flow rate controlled to be a preset flow rate by the flow rate controller 34 is discharged toward the surface of the substrate 3 from the rinse liquid discharge nozzle 32. During a period after stopping the discharge of the cleaning liquid and before starting the discharge of the rinse liquid, the cleaning liquid may remain at least at both sides of a circuit pattern formed on the surface of the substrate 3 (see FIG. 10B). The rinse liquid discharge nozzle 32 is horizontally moved along the substrate 3 toward the left outside of the substrate 3 from above the central portion thereof by the second nozzle moving device 35. The rinse liquid supplied onto the substrate 3 is collected into the collecting cup 44 and discharged to the outside from the drain 45. Thereafter, the discharge of the rinse liquid is stopped by the flow rate controller 34. Then, at the end of the rinse process, the second nozzle moving device 35 moves the arm 31 such that the rinse liquid discharge nozzle 32 is moved to the left side retreat position at the outside of the substrate 3.

Subsequently, the substrate processing apparatus 1 performs a dry process on the substrate 3 by removing the rinse liquid from the surface of the substrate 3 while rotating the substrate 3 (dry process). This dry process includes a substitution process (first dry process) of substituting the rinse liquid on the surface of the substrate 3 with a substitution liquid; a central portion dry process (second dry process) of drying only the central portion of the substrate 3 by discharging an inert gas to the central portion of the substrate 3; and a peripheral portion dry process (third dry process) of drying an entire region of the substrate 3 gradually from the central portion toward a peripheral portion thereof by discharging the inert gas while moving from the central portion of the substrate 3 toward the peripheral portion thereof.

Figure 6:
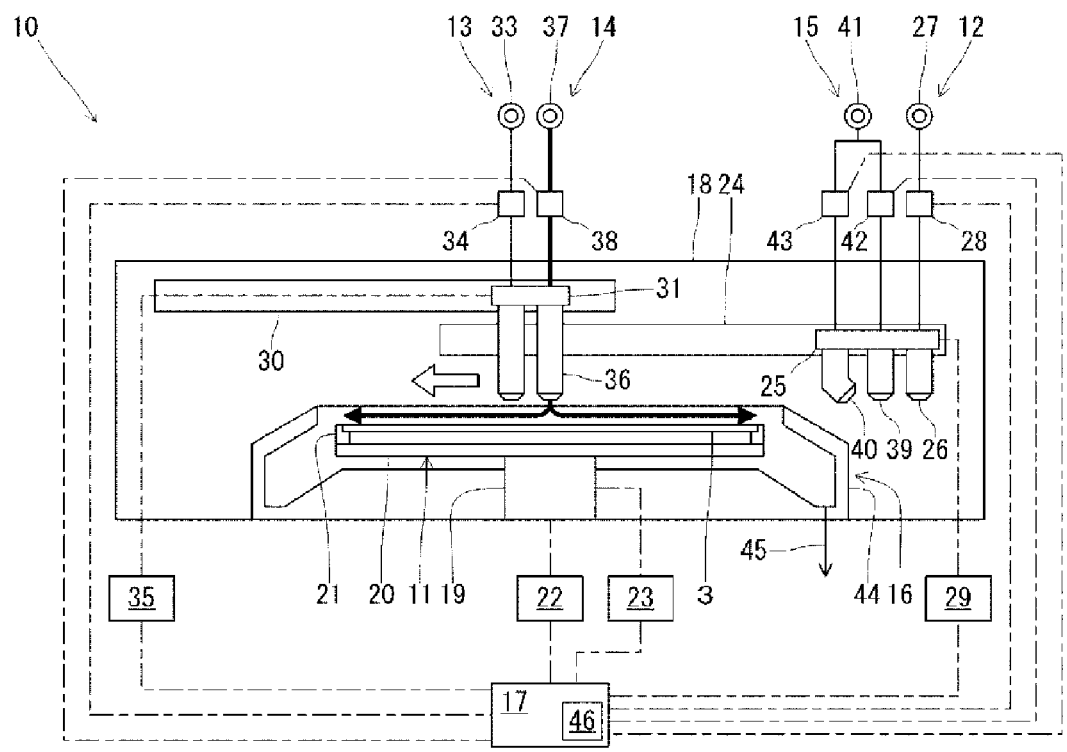
FIG. 6 is a diagram for describing an operation (substitution process) of the substrate liquid processing apparatus in accordance with the first example embodiment.

In the substitution process, as shown in FIG. 6, the controller 17 controls the second nozzle moving device 35 to move the arm 31 such that the substitution liquid discharge nozzle 36 is moved to the supply start position above the central portion of the substrate 3. Then, the substitution liquid having a flow rate controlled to be a preset flow rate by the flow rate controller 38 is discharged vertically downward toward the surface of the substrate 3 from the substitution liquid discharge nozzle 36.

In this substitution process, the rinse liquid remaining on the surface of the substrate 3 in the rinse process is substituted with the substitution liquid, and a liquid film 47 (see FIG. 8) of the substitution liquid or the substitution liquid containing the rinse liquid is formed on the surface of the substrate 3.

Figure 7:
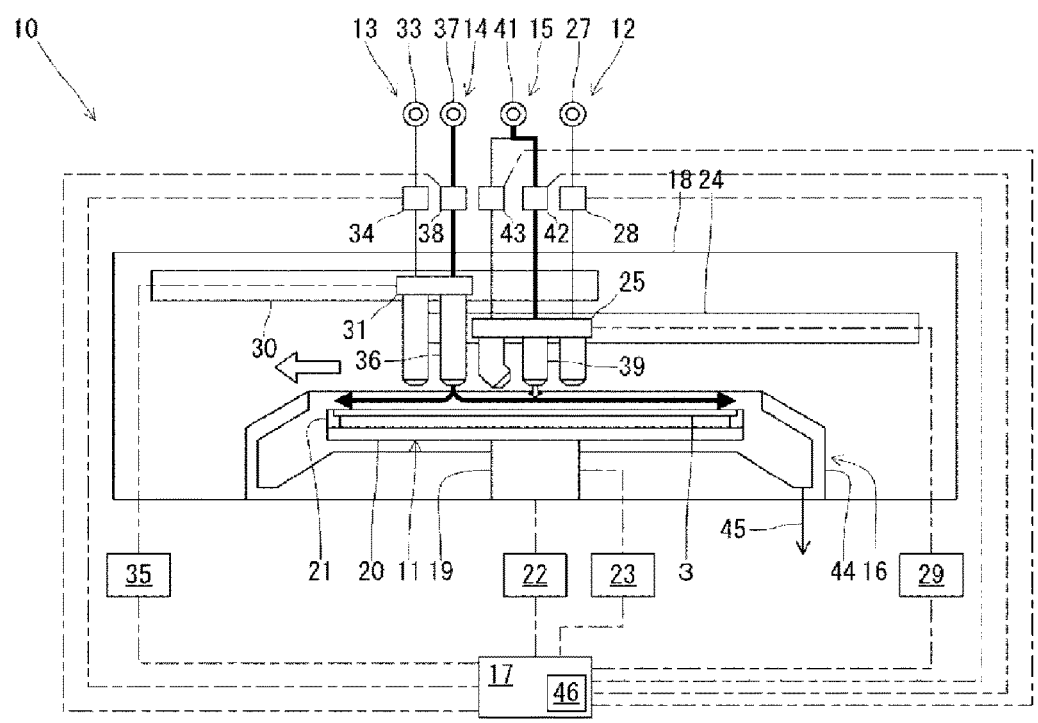
FIG. 7 is a diagram for describing an operation (central portion dry process) of the substrate liquid processing apparatus in accordance with the first example embodiment.

Then, in the central portion dry process, as depicted in FIG. 7, the controller 17 controls the first nozzle moving device 29 to move the arm 25 such that the first inert gas discharge nozzle 39 is moved to the supply start position above the central portion of the substrate 3. Then, the inert gas having a flow rate controlled to be a preset flow rate by the flow rate controller 42 is discharged vertically downward toward the surface of the substrate 3 from the first inert gas discharge nozzle 39. At this time, the first nozzle moving device 29 is not driven, and the first inert gas discharge nozzle 39 is positioned above the central portion of the substrate 3. Further, in this central portion dry process, while the substitution liquid discharge nozzle 36 is horizontally moved along the substrate 3 toward the left outside thereof by the second nozzle moving device 35, the substitution liquid having the preset flow rate controlled by the flow rate controller 38 is kept being discharged vertically downward toward the surface of the substrate 3 from the substitution liquid discharge nozzle 36.

Figure 8:
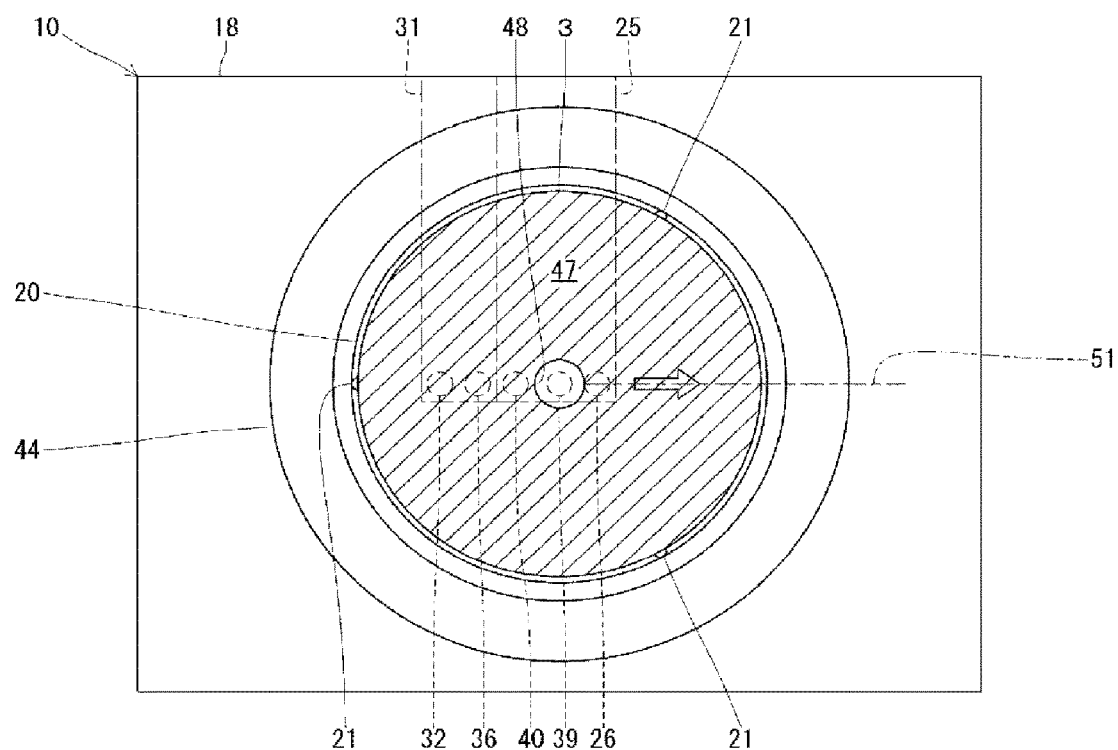
FIG. 8 is an enlarged diagram for describing an operation of the substrate liquid processing apparatus in accordance with the first example embodiment.

In this central portion dry process, as shown in FIG. 8, the inert gas is discharged vertically downward toward the central portion of the substrate 3 from the first inert gas discharge nozzle 39, which has been located at the position above the central portion of the substrate 3. Accordingly, only a central portion of the liquid film 47 formed on the surface of the substrate 3 in the substitution process, which corresponds to the portion of the substrate 3, is removed, so that only the central portion of the substrate 3 is partially dried. As a result, an interface 48, where the liquid film of the substitution liquid is thicker at the central portion of the substrate than at the peripheral portion thereof, is formed on the surface of the substrate 3. At this time, since the inert gas is discharged vertically downward, the substantially circular interface 48 may be formed at the central portion of the substrate 3, when viewed from above. In this way, by discharging the inert gas vertically downward toward the central portion of the substrate 3, it is possible to increase the interface 48 from the central portion of the substrate 3 toward the peripheral portion thereof uniformly, so that the substitution liquid can be pushed away toward the periphery of the substrate 3 effectively.

Figure 9:
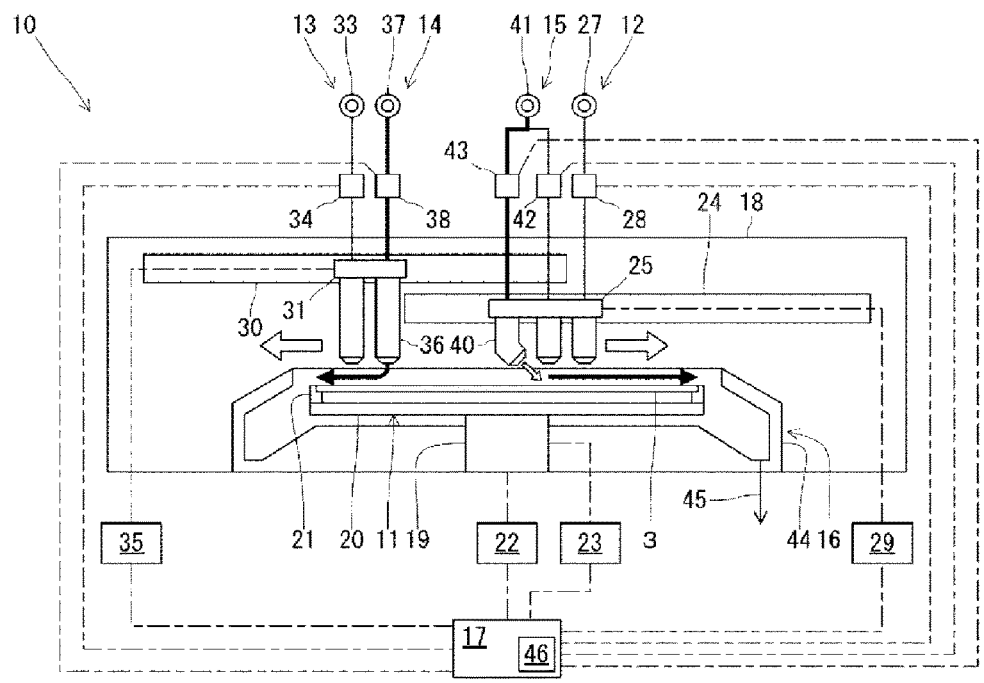
FIG. 9 is a diagram for describing an operation (peripheral portion dry process) of the substrate liquid processing apparatus in accordance with the first example embodiment.

Afterward, in the peripheral portion dry process, as illustrated in FIG. 9, the controller 17 controls the flow rate controller 42 to stop the discharge of the inert gas from the first inert gas discharge nozzle 39. Then, the first nozzle moving device 29 moves the arm 25 such that the second inert gas discharge nozzle 40 is moved to the supply start position above the central portion of the substrate 3. Thereafter, the inert gas having a flow rate controlled to be a preset flow rate by the flow rate controller 43 is discharged from the second inert gas discharge nozzle 40 toward the surface of the substrate 3 in an inclined direction from above the substrate 3 toward an outer periphery thereof. At this time, the second inert gas discharge nozzle 40 is horizontally moved along the substrate 3 from the central portion of the substrate 3 toward a right peripheral portion thereof by the first nozzle moving device 29 while discharging the inert gas toward a position in the vicinity of a front side (a side where no liquid film is formed) of the interface. Further, in the peripheral portion dry process, while the second nozzle moving device 35 horizontally moves the substitution liquid discharge nozzle 36 along the substrate 3 toward the left side position at the outside of the substrate 3, the substitution liquid controlled to have the preset flow rate by the flow rate controller 38 is kept being discharged vertically downward toward the surface of the substrate 3 from the substitution liquid discharge nozzle 36. As a result, the interface 48, where the liquid film of the substitution liquid is thicker at the central portion of the substrate than at the peripheral portion thereof, has been formed on the surface of the substrate 3. Further, the inert gas is discharged toward a central side of the substrate inner than the interface 48. Then, the discharge of the substitution liquid and the discharge of the inert gas are stopped by the flow rate controller 38 and 43, respectively. With a lapse of a preset time after stopping the discharge of the substitution liquid and the discharge of the inert gas, the rotation of the substrate 3 (turntable 20) is stopped by the substrate rotating device 22. Then, at the end of the peripheral portion dry process, the second nozzle moving device 35 moves the arm 31 such that the substitution liquid discharge nozzle 36 is moved to the left side retreat position at the outside of the substrate 3. Further, the first nozzle moving device 29 moves the arm 25 such that the first inert gas discharge nozzle 39 and the second inert gas discharge nozzle 40 are moved to the right side retreat positions at the outside of the substrate 3. In this way, by discharging the substitution liquid vertically downward toward the substrate 3, it is possible to diffuse the substitution liquid into gaps between circuit patterns formed on the surface of the substrate 3. Further, by discharging the inert gas to the interface of the liquid film formed on the surface of the substrate 3, it is possible to push away the substitution liquid with the inert gas effectively, so that particles may be suppressed from being left or the circuit patterns may be suppressed from being damaged.

In the peripheral portion dry process, as depicted in FIG. 9, the controller 17 moves the substitution liquid discharge nozzle 36 toward the left side from above the central portion of the substrate 3 in the left direction, and also moves the second inert gas discharge nozzle 40 toward the right side from above the central portion of the substrate 3 in the right direction. By moving the substitution liquid discharge nozzle 36 and the second inert gas discharge nozzle 40 in different directions in this way, the inert gas from the second inert gas discharge nozzle 40 may not be discharged to a portion where the liquid film 47 of the substitution liquid, which is formed on the surface of the substrate 3 immediately after discharged to the substrate 3 from the substitution liquid discharge nozzle 36, is relatively thicker, but may be discharged to a portion where the liquid film 47 of the substitution liquid becomes relatively thinner. Accordingly, it may be possible to suppress the substitution liquid from being dispersed by a wind pressure of the inert gas. Thus, the flow rate of the inert gas discharged from the second inert gas discharge nozzle 40 may be increased.

Figure 10A:
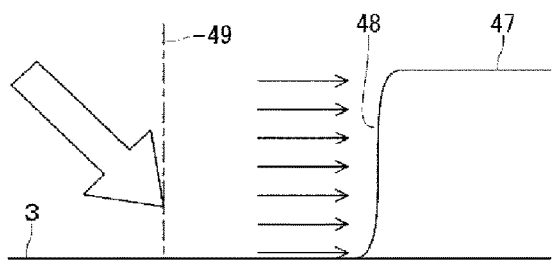
FIG. 10A to FIG. 10D are enlarged diagrams for describing operations of the substrate liquid processing apparatus in accordance with the first example embodiment.
Figure 10B:
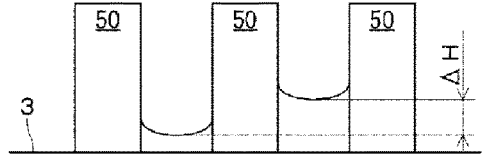

Further, in the peripheral portion dry process, as depicted in FIG. 9, the controller 17 controls the second inert gas discharge nozzle 40 to discharge the inert gas toward the substrate 3 in an inclined direction with respect to the substrate 3 from above the substrate 3. Accordingly, as shown in FIG. 10A, the inert gas discharged in the inclined direction with respect to a normal line 49 of the substrate 3 may have a substantially uniform velocity distribution (pressure distribution) in a direction (horizontal direction) along the surface of the substrate 3 within an entire thickness range of the liquid film 47 at the vicinity of the surface of the substrate 3. As a result, the inert gas may push away the substitution liquid toward the periphery of the substrate 3 while uniformly contacting with the interface 48 of the liquid film 47 of the substitution liquid. In this way, by discharging the inert gas in the inclined direction with respect to the substrate 3, a drying performance of the inert gas may be improved, so that a moving speed of the second inert gas discharge nozzle 40 can be increased. As a consequence, the time taken for drying the substrate 3 can be shortened, and consumption of the substitution liquid can be reduced. Further, as illustrated in FIG. 10B, the inert gas may be discharged to a relatively wide range on the surface of the substrate 3. Accordingly, the inert gas may be discharged toward both sides of the circuit patterns 50 formed on the surface of the substrate 3, and a difference ΔH in liquid surfaces of the substitution liquid remaining at both sides of the circuit patterns 50 may be reduced. Here, a stress F applied to the circuit pattern 50 (i.e., a stress causing a damage of the circuit pattern 50) may be represented as follows.

$$F = 2 \cdot \gamma \cdot \cos \theta \cdot \Delta H \cdot D/S \qquad \text{Eq. (1)}$$

γ: Surface tension
θ: Contact angle
D: Length of the circuit pattern 50
S: Distance between the circuit patterns 50

Figure 10C:
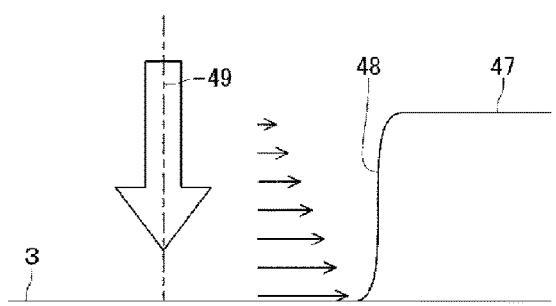
Figure 10D:
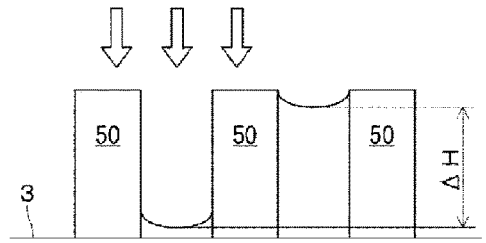

If the difference ΔH in the liquid surfaces at both sides of the circuit patterns 50 is reduced, the external force (i.e., the damaging stress F) applied to the circuit pattern 50 may also be decreased, as calculated by Eq. (1). Thus, it may be possible to suppress the circuit pattern 50 from being damaged. Meanwhile, when discharging the inert gas in the same direction as the normal line 49 of the substrate 3, a velocity (pressure) of the inert gas in the direction (horizontal direction) along the surface of the substrate 3 at the vicinity of the surface of the substrate 3 may be increased at a portion closer to the surface of the substrate 3, as shown in FIG. 10C. Moreover, the inert gas may be discharged to a relatively narrow range on the surface of the substrate 3, as depicted in FIG. 10D, and a difference ΔH in liquid surfaces at both sides of the circuit patterns 50 may be increased. As a result, the damaging stress F, which is calculated from Eq. (1), may also be increased, so that the circuit pattern 50 may be damaged.

In this peripheral portion dry process, under the control of the controller 17, the inert gas is discharged toward the interface 48 which has been formed on the surface of the substrate 3 in the central portion dry process. Accordingly, a dried portion (interface 48) can be expanded outward from the central portion of the substrate 3 toward the peripheral portion thereof with the central portion of the substrate 3 dried in the central portion dry process as a nucleus. Thereafter, in the peripheral portion dry process, the inert gas is discharged toward the expanded interface 48 while being moved outward toward the outside of the substrate 3. As a consequence, the interface 48 may be gradually expanded from the central portion of the substrate 3 to the outer edge thereof, so that the substitution liquid may be pushed away to the outside of the substrate 3 over the entire surface of the substrate 3.

Further, in the peripheral portion dry process, the controller 17 controls the second inert gas discharge nozzle 40 to discharge the inert gas in the inclined direction (see FIG. 8) toward a normal line direction (a straight line direction connecting the central portion of the substrate 3 with the edge portion thereof) of the interface 48 formed on the surface of the substrate 3. Accordingly, the inert gas may be uniformly discharged to the interface 48, so that the drying performance of the inert gas may be improved.

Further, in the peripheral portion dry process, under the control of the controller 17, the second inert gas discharge nozzle 40 is moved from the central portion of the substrate 3 toward the outside thereof at a gradually decreased speed. Accordingly, a discharge rate of the inert gas per a unit area of the substrate 3 can be controlled to be constant. Therefore, the amount of the inert gas discharged to the substitution liquid may be uniformed, so that the entire surface of the substrate 3 can be uniformly dried. Further, as the amount of the inert gas discharged to the substitution liquid is uniformed, the liquid surfaces can be uniformly lowered at both sides of the circuit patterns 50, and the difference ΔH in the liquid surfaces can be reduced. Thus, the damaging stress F calculated from Eq. (1) may be decreased, so that it may be possible to suppress the circuit pattern 50 from being damaged. In this case, like the second inert gas discharge nozzle 40, the substitution liquid discharge nozzle 36 may be moved at the speed that allows a discharge rate of the substitution liquid per a unit area of the substrate 3 to be constant. By moving the substitution liquid discharge nozzle 36 and the second inert gas discharge nozzle 40 at the same speed, it may be possible to dry the entire surface of the substrate 3 more uniformly.

In the peripheral portion dry process, the controller 17 controls the second inert gas discharge nozzle 40 to discharge the inert gas toward the substrate 3 in the inclined direction from above the substrate 3 toward the outer periphery thereof. Desirably, the discharging angle may be in the range from, e.g., about 40 degrees to about 60 degrees, and, most desirably, about 45 degrees with respect to the normal line of the substrate 3. Further, as the second inert gas discharge nozzle, a single nozzle may be moved from the central portion of the substrate 3 toward the outside thereof, or multiple nozzles may be moved while being replaced on the way. Furthermore, the second inert gas discharge nozzle may have a structure in which multiple nozzles or multiple discharge openings are provided at the arm 25.

Finally, as shown by the dashed dotted line in FIG. 2, the substrate processing apparatus 1 transfers the processed substrate 3 from the substrate liquid processing apparatus 10 to the substrate transfer device 9 (substrate transferring process).

In this substrate transferring process, the controller 17 controls the substrate elevating device 23 to move up the turntable 20 to a preset position. Then, the substrate 3 held on the turntable 20 is transferred to the substrate transfer device 9. Thereafter, the turntable 20 is moved down to a preset position by the substrate elevating device 23.

As stated above, in the substrate processing apparatus 1 (in the substrate processing method performed in the substrate processing apparatus 1), the substitution liquid is discharged toward the substrate 3 while being relatively moved with respect to the substrate 3. Further, the inert gas is discharged to the substrate 3 from above the substrate 3 in the inclined direction with respect to the substrate 3 while being moved in a direction different from the substitution liquid moving direction. Therefore, the time taken for drying the substrate 3 can be shortened, and consumption of the substitution liquid can be reduced. Therefore, it may be possible to improve a throughput and reduce a running cost in substrate processing.

Second Example Embodiment

In the substrate liquid processing apparatus 10 in accordance with the first example embodiment, the cleaning liquid discharge nozzle 26, the first inert gas discharge nozzle 39 and the second inert gas discharge nozzle 40 are provided at the same arm 25 to be moved as one body by the first nozzle moving device 29. Further, the rinse liquid discharge nozzle 32 and the substitution liquid discharge nozzle 36 are provided at the same arm 31 to be moved as one body by the second nozzle moving device 35. However, the example embodiment may not be limited to this configuration example as long as the substitution liquid discharge nozzle 36 and the second inert gas discharge nozzle 40 can be moved in different directions.

Figure 12:
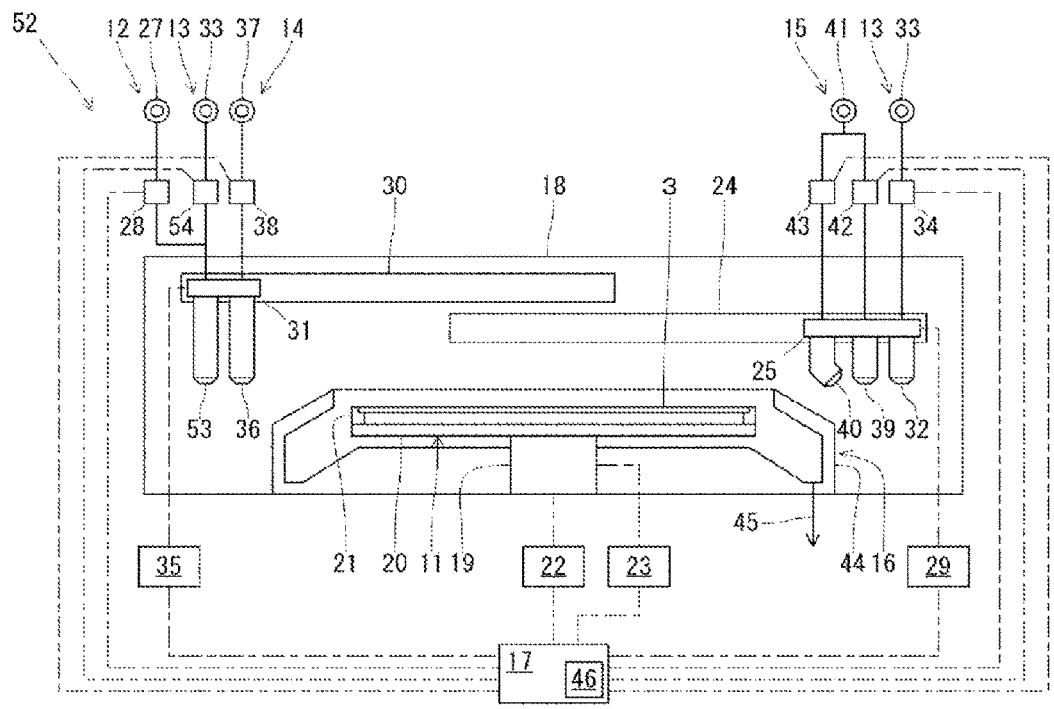
FIG. 12 is a side cross sectional view illustrating a substrate liquid processing apparatus in accordance with a second example embodiment.

By way of example, referring to FIG. 12, in a substrate liquid processing apparatus 52 in accordance with a second example embodiment, the rinse liquid discharge nozzle 32 is provided at the arm 25 where the first inert gas discharge nozzle 39 and the second inert gas discharge nozzle 40 are provided, and a cleaning liquid/rinse liquid discharge nozzle 53 is provided at the arm 31 where the substitution liquid discharge nozzle 36 is provided. The cleaning liquid supply source 27 and the rinse liquid supply source 33 are connected to the cleaning liquid/rinse liquid discharge nozzle 53 via the flow rate controller 28 and flow rate controller 54, respectively. In this configuration, a cleaning liquid or a rinse liquid may be selectively discharged from the cleaning liquid/rinse liquid discharge nozzle 53. In the following description of the second example embodiment, the same parts as those described in the first example embodiment will be assigned same reference numerals, and redundant description will be omitted.

Figure 13:
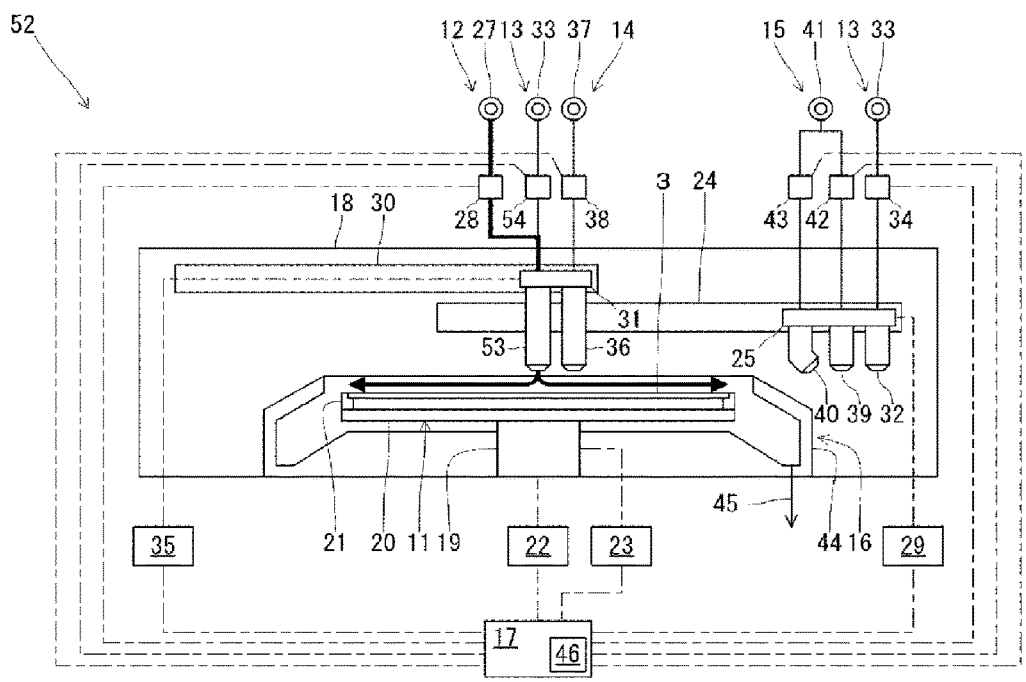
FIG. 13 is a diagram for describing an operation (cleaning process) of the substrate liquid processing apparatus in accordance with the second example embodiment.

In the substrate liquid processing apparatus 52 in accordance with the second example embodiment, a cleaning process is performed as shown in FIG. 13 after a substrate receiving process is performed, as in the substrate liquid processing apparatus 10 in accordance with the first example embodiment.

In this cleaning process, a controller 17 controls the second nozzle moving device 35 to move the arm 31, such that the cleaning liquid/rinse liquid discharge nozzle 53 is moved to the supply start position above the central portion of the substrate 3. Further, by rotating the turntable 20 at a certain rotation speed through the substrate rotating device 22, the substrate 3 is rotated. Thereafter, a cleaning liquid having a flow rate controlled to be a preset flow rate by the flow rate controller 28 is discharged toward a surface of the substrate 3 from the cleaning liquid/rinse liquid discharge nozzle 53. Thereafter, the discharge of the cleaning liquid is stopped by the flow rate controller 28.

Figure 14:
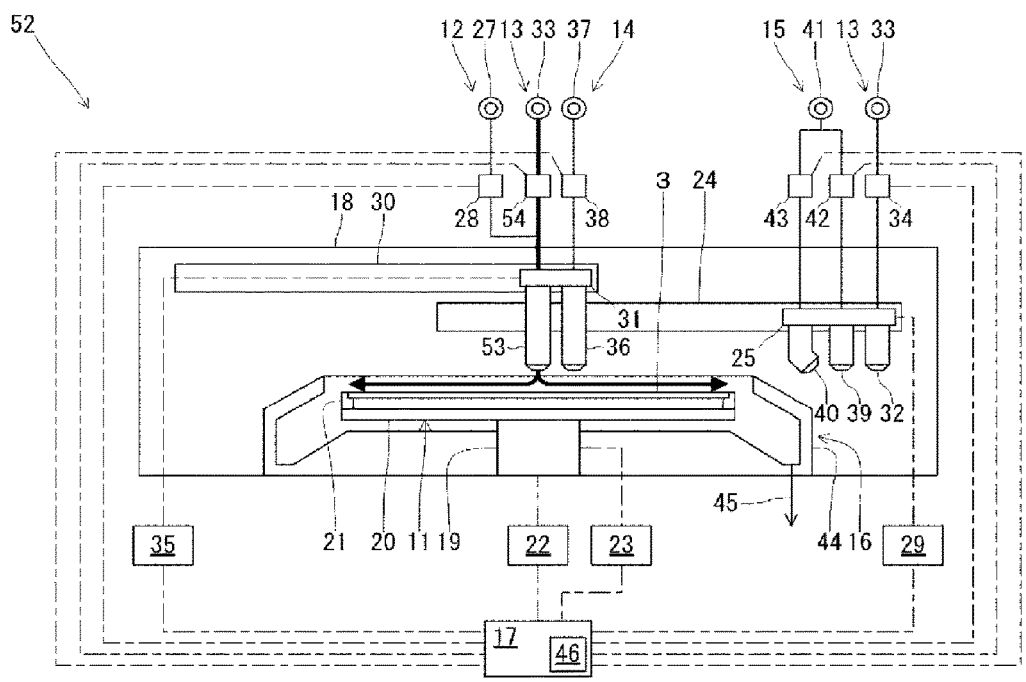
FIG. 14 is a diagram for describing an operation (first half of rinse process) of the substrate liquid processing apparatus in accordance with the second example embodiment.
Figure 15:
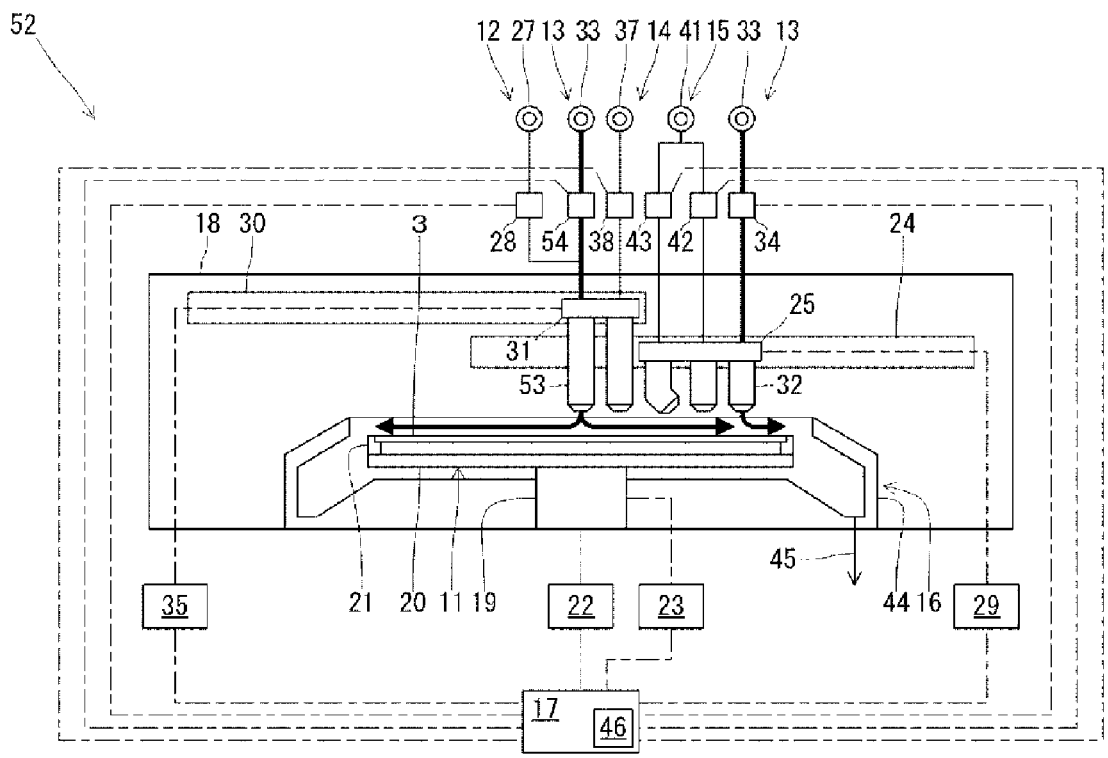
FIG. 15 is a diagram for describing an operation (second half of rinse process) of the substrate liquid processing apparatus in accordance with the second example embodiment.

Then, as illustrated in FIG. 14 and FIG. 15, the substrate liquid processing apparatus 52 performs a rinse process on the surface of the substrate 3 with a rinse liquid (rinse process).

In this rinse process, as shown in FIG. 14, under the control of the controller 17, a rinse liquid having a flow rate controlled to be a preset flow rate by the flow rate controller 54 is discharged toward the surface of the substrate 3 from the cleaning liquid/rinse liquid discharge nozzle 53 which has been moved to the supply start position above the central portion of the substrate 3 in the previous cleaning process. As a result, a liquid film of the rinse liquid is formed on the surface of the substrate 3. Thereafter, as shown in FIG. 15, the controller 17 controls the first nozzle moving device 29 to move the rinse liquid discharge nozzle 32 to a position above the peripheral portion of the substrate 3. Then, while horizontally moving the rinse liquid discharge nozzle 32 toward an outer periphery of the substrate 3 by the first nozzle moving device 29, the rinse liquid having a flow rate controlled to be a preset flow rate by the flow rate controller 34 is discharged toward the surface of the substrate 3 from the rinse liquid discharge nozzle 32. At this time, a moving speed or a moving range of the rinse liquid discharge nozzle 32 or a rinse liquid discharge rate is adjusted to maintain the state where the liquid film of the rinse liquid on the surface of the substrate 3 is formed.

Subsequently, the substrate liquid processing apparatus 52 performs the dry process of the substrate 3 by removing the rinse liquid in the form of the liquid film formed on the surface of the substrate 3 (dry process). This dry process may be performed by using the first inert gas discharge nozzle 39 and the second inert gas discharge nozzle 40, as in the substrate liquid processing apparatus 10 in accordance with the first example embodiment.

Figure 16:
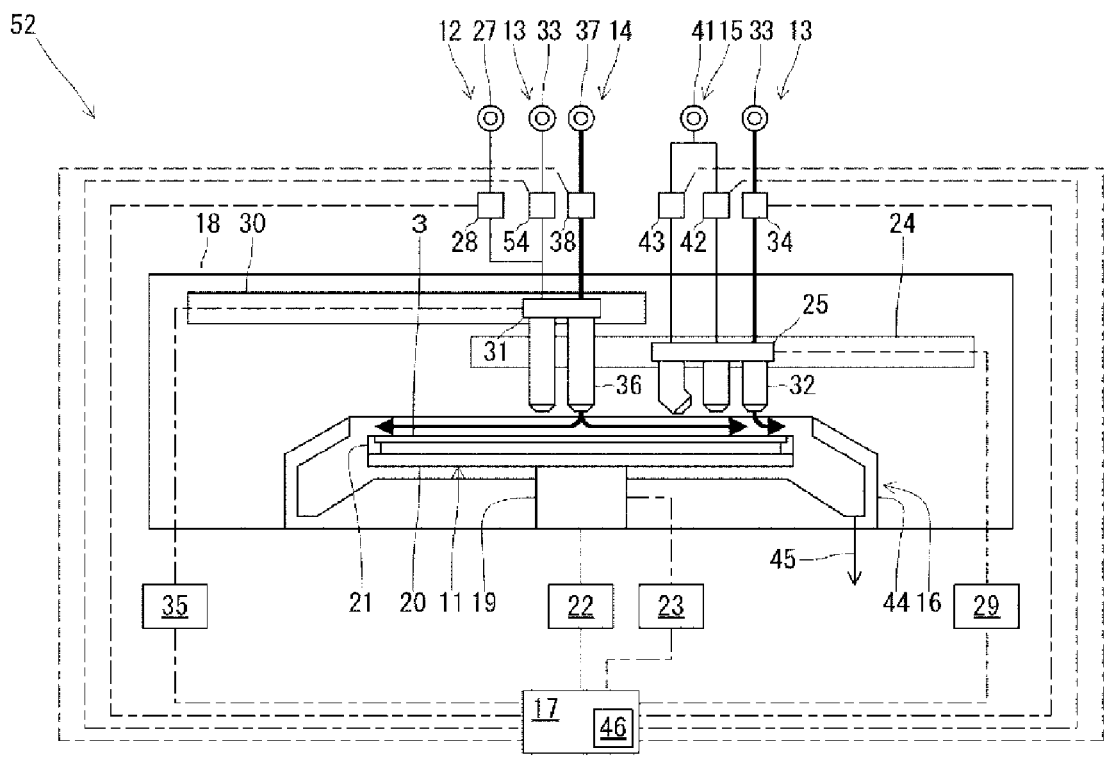
FIG. 16 is a diagram for describing an operation (first half of substitution process) of the substrate liquid processing apparatus in accordance with the second example embodiment.
Figure 17:
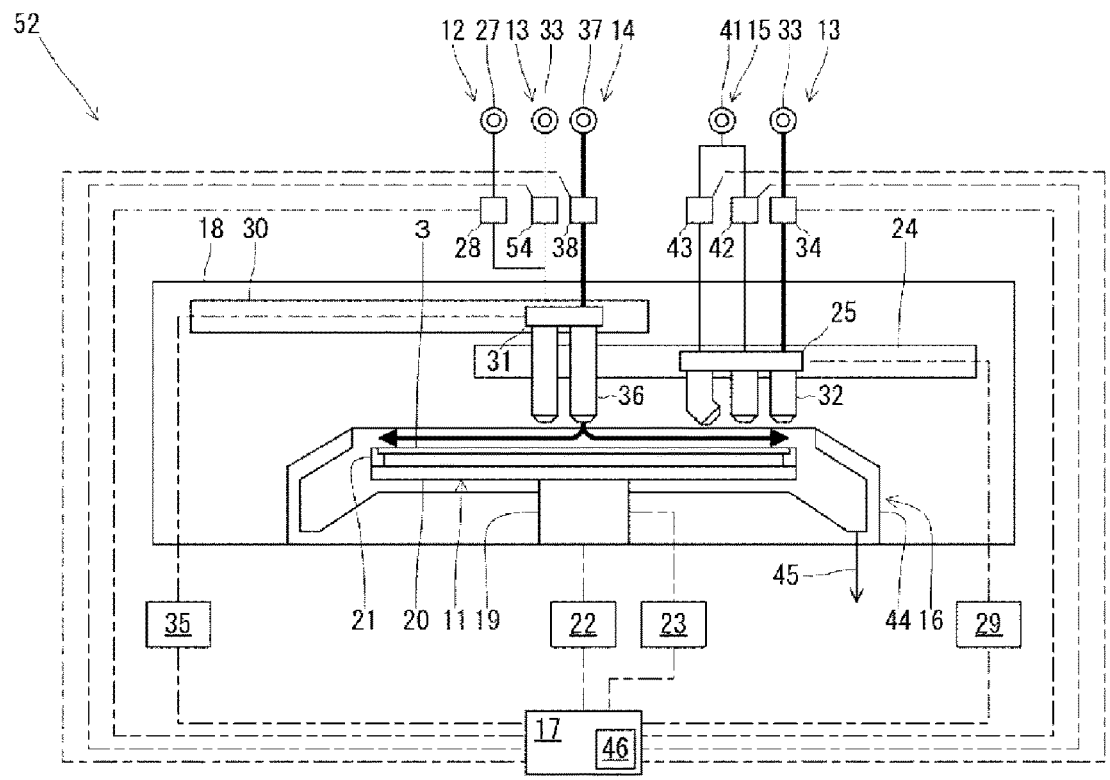
FIG. 17 is a diagram for describing an operation (second half of substitution process) of the substrate liquid processing apparatus in accordance with the second example embodiment.

That is, in the substitution process, as shown in FIG. 16, under the control of the controller 17, the rinse liquid discharge nozzle 32 is stopped at a preset position above the peripheral portion of the substrate 3, and, then, the rinse liquid is discharged toward the substrate 3. Then, by moving the arm 31 through the second nozzle moving device 35, the substitution liquid discharge nozzle 36 is moved to the supply start position above the central portion of the substrate 3. Thereafter, the supply of the rinse liquid from the cleaning liquid/rinse liquid discharge nozzle 53 is stopped by the flow rate controller 54. Further, a substitution liquid having a flow rate controlled to be a preset flow rate by the flow rate controller 38 is discharged vertically downward toward the surface of the substrate 3 from the substitution liquid discharge nozzle 36. Accordingly, the substitution liquid is supplied onto the surface of the substrate 3 where the liquid film of the rinse liquid has been formed. Then, as shown in FIG. 17, the controller 17 controls the flow rate controller 34 to stop the discharge of the rinse liquid. As a result, on the surface of the substrate 3, the rinse liquid is pushed away from the outer peripheral portion of the substrate 3 by the substitution liquid, the rinse liquid remaining on the surface of the substrate 3 in the rinse process is substituted with the substitution liquid, and the liquid film 47 (see FIG. 8) containing the substitution liquid or the rinse liquid is formed on the surface of the substrate 3.

Thereafter, the substrate liquid processing apparatus 52 performs the dry process (central portion dry process, a peripheral portion dry process) and the substrate transferring process, as in the substrate liquid processing apparatus 10 in accordance with the first example embodiment.

In the substrate liquid processing apparatus 10 in accordance with the first example embodiment, in the substitution process, by supplying the rinse liquid onto the surface of the substrate 3, the liquid film of the rinse liquid is formed, and by starting the supply of the substitution liquid after stopping the supply of the rinse liquid, the rinse liquid is substituted with the substitution liquid. However, when the liquid film of the rinse liquid is formed on the surface of the substrate 3, a centrifugal force caused by the rotation of the substrate 3 may be applied to the liquid film of the rinse liquid. The centrifugal force is greater at the peripheral portion of the substrate 3 than at the central portion thereof. Accordingly, before the liquid film of the substitution liquid is formed on the entire surface of the substrate 3, the liquid film of the rinse liquid may be dispersed from the peripheral portion of the substrate 3. Thus, a liquid film of the substitution liquid may not be formed on the peripheral portion of the substrate 3, but liquid droplets of the substitution liquid may be formed thereat. In such a case, a material in the atmosphere may be introduced into the liquid droplets, so that a water mark may be formed on the surface of the substrate 3 or particles are left thereon. As a resolution, it may be considered to reduce the centrifugal force by setting the rotation speed of the substrate 3 to be low when supplying the substitution liquid, so that the liquid film of the rinse liquid can be maintained. In such a case, however, a processing time may be increased, and a throughput of the substrate processing apparatus 1 may be reduced. Further, in order to form the liquid film of the substitution liquid securely, it may be considered to increase a flow rate of the substitution liquid. However, consumption of the substitution liquid may be increased in such a case.

Meanwhile, in the substrate liquid processing apparatus 52 in accordance with the second example embodiment, in the substitution process, the liquid film of the rinse liquid is formed by supplying the rinse liquid onto the surface of the substrate 3. Further, without stopping the supply of the rinse liquid, i.e., while supplying the rinse liquid onto the substrate 3, the supply of the substitution liquid is started, so that the rinse liquid is substituted with the substitution liquid. Accordingly, the liquid film of the substitution liquid can be formed on the surface of the substrate 3 while the liquid film still exists on the peripheral portion of the substrate 3 without being dispersed. Thus, in the substrate liquid processing apparatus 52 in accordance with the second example embodiment, it may be possible to suppress a water mark from being formed or particles from being left on the surface of the substrate 3 without deteriorating a throughput of the substrate processing apparatus 1, so that the substrate 3 is securely processed. As a consequence, it may be possible to form the liquid film of the substitution liquid without increasing the consumption of the substitution liquid.

Furthermore, in the substrate liquid processing apparatus 52 in accordance with the second example embodiment, the liquid film of the processing liquid is formed by supplying the processing liquid when performing the substitution process after the rinse process. However, the second example embodiment may not be limited thereto but may also be applicable to a case of, for example, performing a substitution process of substituting a processing liquid (hydrophobizing liquid) with a substitution liquid after hydrophobizing the substrate 3 with the processing liquid (hydrophobizing liquid).

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing method of processing a substrate with a processing liquid and drying the substrate, the substrate processing method comprising:
   discharging the processing liquid toward the substrate while rotating the substrate, and then;
   discharging a substitution liquid from a substitution liquid discharge nozzle toward the substrate while moving the substitution liquid discharge nozzle relatively with respect to the substrate to form a liquid film of the substitution liquid on the substrate;
   discharging a first inert gas, from a first inert gas discharge nozzle provided vertically downward, vertically downward from above a central portion of the substrate toward a central portion of the liquid film of the substitution liquid formed on the substrate while horizontally moving the substitution liquid discharge nozzle along the substrate toward a peripheral portion thereof and without moving the first inert gas discharge nozzle to form an interface where the liquid film of the substitution liquid is thicker at a peripheral portion side of the substrate than at a central portion side thereof and to increase an area confined by the interface uniformly from the central portion of the substrate toward the peripheral portion thereof; and then
   pushing the interface from the central portion of the substrate toward the peripheral portion thereof by discharging a second inert gas, from a second inert gas discharge nozzle provided to be inclined downward, toward the substrate in an inclined direction from above the substrate toward the peripheral portion of the substrate while moving the second inert gas discharge nozzle relatively with respect to the substrate in a direction different from a direction in which the substitution liquid is moved.

2. The substrate processing method of claim 1,
wherein, in the pushing the interface, the substitution liquid is discharged toward the substrate while moving from the central portion of the substrate toward the peripheral portion thereof, and
the second inert gas is discharged toward the central portion side of the substrate inner than the interface.

3. The substrate processing method of claim 2, wherein the second inert gas is discharged in the inclined direction toward a normal line direction of the interface of the substitution liquid formed on the substrate.

4. The substrate processing method of claim 2, wherein, in the pushing the interface, the second inert gas is discharged while moving the second inert gas discharge nozzle from above the central portion of the substrate toward the peripheral portion thereof.

5. The substrate processing method of claim 2, wherein, before the substitution liquid is discharged toward the substrate while moving with respect to the substrate, the processing liquid is substituted with the substitution liquid by discharging the substitution liquid toward the substrate from above the central portion of the substrate.

6. The substrate processing method of claim 5, wherein, when forming the liquid film of the substitution liquid on the substrate by discharging the substitution liquid toward the substrate, a liquid film of the processing liquid is formed by discharging the processing liquid toward a peripheral side of the substrate outer than a position where the substitution liquid is discharged, and then, the liquid film of the substitution liquid is formed by stopping the discharge of the processing liquid.

7. The substrate processing method of claim 1, wherein the second inert gas is discharged while moving at a speed where a discharge rate of the second inert gas per a unit area of the substrate is controlled to be constant.

8. The substrate processing method of claim 1, wherein the substitution liquid is discharged while moving at a speed where a discharge rate of the substitution liquid per a unit area of the substrate is controlled to be constant.

9. The substrate processing method of claim 1, wherein the second inert gas and the substitution liquid are discharged while moving at the same speed.

10. The substrate processing method of claim 1, the discharging the second inert gas is started after the discharging the first inert gas is stopped.

11. A computer-readable storage medium having stored thereon computer-executable instructions that, in response to execution, cause a substrate processing apparatus to perform a substrate processing program of processing a substrate with a processing liquid and drying the substrate, wherein the substrate processing apparatus includes:

a substrate rotating device configured to rotate the substrate;

a processing liquid discharging unit configured to discharge the processing liquid toward the substrate;

a substitution liquid discharging unit configured to discharge a substitution liquid, which is substituted with the processing liquid on the substrate, toward the substrate; and an inert gas discharging unit configured to discharge an inert gas toward the substrate, the inert gas discharging unit including a first inert gas discharge nozzle provided vertically downward and a second inert gas discharge nozzle provided to be inclined downward, and wherein the substrate processing program includes:

discharging the processing liquid toward the substrate from the processing liquid discharging unit while rotating the substrate by the substrate rotating device, and then;

discharging the substitution liquid from the substitution liquid discharge unit toward the substrate from the substitution liquid discharging unit while moving the substitution liquid discharging unit relatively with respect to the substrate to form a liquid film of the substitution liquid on the substrate;

discharging a first inert gas, from the first inert gas discharge nozzle, vertically downward from above a central portion of the substrate toward a central portion of the liquid film of the substitution liquid formed on the substrate while horizontally moving the substitution liquid discharge unit along the substrate toward a peripheral portion thereof and without moving the first inert gas discharge nozzle to form an interface where the liquid film of the substitution liquid is thicker at a peripheral portion side of the substrate than at a central portion side thereof and to increase an area confined by the interface uniformly from the central portion of the substrate toward a peripheral portion thereof, and then pushing the interface from the central portion of the substrate toward the peripheral portion thereof by discharging a second inert gas, from the second inert gas discharge nozzle, toward the substrate in an inclined direction from above the substrate toward the peripheral portion of the substrate while moving the second inert gas discharge nozzle relatively with respect to the substrate in a direction different from a direction in which the substitution liquid discharging unit is moved.

* * * * *